United States Patent
Lin et al.

(10) Patent No.: US 11,411,161 B2
(45) Date of Patent: Aug. 9, 2022

(54) PIEZOELECTRIC SENSING SYSTEM AND PIEZOELECTRIC SENSING CIRCUIT

(71) Applicant: INDUSTRIAL TECHNOLOGY RESEARCH INSTITUTE, Hsinchu (TW)

(72) Inventors: Chih-Hsiou Lin, Kaohsiung (TW); Shih-Ting Lin, Hualien (TW); Chung-Yuan Su, Tainan (TW); Chao-Ta Huang, Hsinchu (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 303 days.

(21) Appl. No.: 16/849,828

(22) Filed: Apr. 15, 2020

(65) Prior Publication Data
US 2021/0202822 A1    Jul. 1, 2021

(30) Foreign Application Priority Data
Dec. 25, 2019 (TW) ................... 108147492

(51) Int. Cl.
*G06F 3/041* (2006.01)
*G09G 5/08* (2006.01)
(Continued)

(52) U.S. Cl.
CPC ............. *H01L 41/042* (2013.01); *G01L 1/16* (2013.01); *H01L 41/1132* (2013.01)

(58) Field of Classification Search
CPC ..... G01L 1/16; H01L 41/1132; H01L 41/042; H01L 1/16; G06F 3/033; G06F 3/02;
(Continued)

(56) References Cited

U.S. PATENT DOCUMENTS

| 4,195,563 A | 4/1980 | Budraitis et al. |
| 4,807,482 A | 2/1989 | Park et al. |

(Continued)

FOREIGN PATENT DOCUMENTS

| CN | 101231187 A | 7/2008 |
| CN | 102668372 A | 9/2012 |

(Continued)

OTHER PUBLICATIONS

TW Office Action in Application No. 108147492 dated Jul. 22, 2020.
(Continued)

*Primary Examiner* — Pegeman Karimi
(74) *Attorney, Agent, or Firm* — Maschoff Brennan (57) ABSTRACT

A piezoelectric system comprises a piezoelectric sensor, a voltage stabilizer, a discharger and an operation sensor. The piezoelectric sensor outputs a sensing signal through a sensor output terminal according to a rate of change of pressure. The voltage stabilizer has a positive terminal electrically connecting with the sensor output terminal. The voltage stabilizer receives the sensing signal, stores the energy of the sensing signal, and keeps the voltage of the sensing signal as a constant when the rate of change of pressure is zero. The discharger has a first terminal connecting with the positive terminal, a second terminal coupled to ground, and a control terminal receiving a trigger signal to control the first terminal to conduct with or not conduct with the second terminal. The operation sensor electrically connects to the control terminal for sensing an operation generating the pressure and outputs the trigger signal accordingly.

16 Claims, 5 Drawing Sheets

(51) Int. Cl.
*H01L 41/04* (2006.01)
*G01L 1/16* (2006.01)
*H01L 41/113* (2006.01)

(58) Field of Classification Search
CPC . G06F 3/041; G09G 5/08; G09G 5/00; G06G 3/045
See application file for complete search history.

(56) References Cited

U.S. PATENT DOCUMENTS

| | | | |
|---|---|---|---|
| 6,439,030 | B2 | 8/2002 | Suzuki et al. |
| 7,997,144 | B1 | 8/2011 | Pekarek et al. |
| 8,789,426 | B1 | 7/2014 | Pekarek et al. |
| 9,141,216 | B2* | 9/2015 | Chang .................... G06F 3/041 |
| 9,778,765 | B2 | 10/2017 | Ishii et al. |
| 10,247,633 | B2* | 4/2019 | Shibata .................. G01L 23/22 |
| 10,891,888 | B2* | 1/2021 | Wu ....................... G09G 3/3233 |
| 2012/0268202 | A1 | 10/2012 | Amstutz et al. |
| 2014/0084991 | A1 | 3/2014 | Hsieh |
| 2014/0236354 | A1 | 8/2014 | Kamiya et al. |
| 2014/0331791 | A1* | 11/2014 | Ishii ....................... H01L 41/042 310/319 |
| 2015/0199061 | A1 | 7/2015 | Kitada et al. |
| 2016/0117035 | A1* | 4/2016 | Watazu .................. G01L 1/142 345/173 |
| 2018/0313704 | A1 | 9/2018 | Yamamura et al. |
| 2019/0196520 | A1 | 6/2019 | Yeh et al. |

FOREIGN PATENT DOCUMENTS

| | | |
|---|---|---|
| CN | 103138696 A | 6/2013 |
| CN | 103207302 A | 7/2013 |
| CN | 103699277 A | 4/2014 |
| CN | 103994845 A | 8/2014 |
| CN | 104641327 A | 5/2015 |
| CN | 106415230 A | 2/2017 |
| CN | 107843363 A | 3/2018 |
| CN | 108375431 A | 8/2018 |
| CN | 108801507 A | 11/2018 |
| CN | 106415230 B | 10/2019 |
| JP | 2014173950 A | 9/2014 |
| TW | I315228 B | 10/2009 |
| TW | M433561 U | 7/2012 |
| TW | 201231945 A | 8/2012 |
| TW | M451191 U | 4/2013 |
| TW | I446134 B | 7/2014 |
| WO | 2016/059940 A1 | 4/2016 |

OTHER PUBLICATIONS

CN Office Action in Application No. 201911356267.3 dated May 10, 2022.

Cong yan-bo, Wang wei-jun, "Automotive Electrical and Electronic Technology Foundation" May 1, 2008.

* cited by examiner

PIEZOELECTRIC SENSING SYSTEM AND PIEZOELECTRIC SENSING CIRCUIT

CROSS-REFERENCE TO RELATED APPLICATIONS

This non-provisional application claims priority under 35 U.S.C. § 119(a) on Patent Application No(s). 108147492 filed in Taiwan on Dec. 25, 2019, the entire contents of which are hereby incorporated by reference.

BACKGROUND

1. Technical Field

The present disclosure relates to piezoelectric sensing technique, and more particularly to a piezoelectric sensing system and a piezoelectric sensing circuit.

2. Related Art

The market of force sensors increases year by year with the rise of the Internet of Things (IoT). International manufacturers devote more resources to the development of production lines of high-end machinery. Processing efficiency and accuracy are expected to be improved if smart sensing technology (including force sensors) and digital images of processed objects are integrated. The smart processing equipment resulted from the integration can improve the yield of product, equipment activation, and production efficiency, and is suitable for the light metal processing market, such as golf heads, hardware, aerospace components, etc.

However, the piezoelectric sensors currently adopted in force sensors usually cannot keep the output voltage level thereof. Even if the force applied to the piezoelectric element is a constant force, the piezoelectric sensors still cannot keep a stable output voltage. Therefore, it is difficult to accurately measure the correlation between the current force and the output voltage.

SUMMARY

According to an embodiment of the present disclosure, a piezoelectric sensing system comprising: a piezoelectric sensor comprising a sensor output terminal, wherein the piezoelectric sensor outputs a sensing signal through the sensor output terminal according to a rate of change of pressure sensed by the piezoelectric sensor; a voltage stabilizer comprising a positive terminal electrically connecting with the sensor output terminal, wherein the voltage stabilizer receives the sensing signal outputted by the piezoelectric sensor, stores an energy of the sensing signal, and keeps a voltage of the sensing signal as a constant when the rate of change of pressure is zero; a discharger comprising a first terminal connecting with the positive terminal, a second terminal coupled to ground, and a control terminal configured to receive a trigger signal and controlling the first terminal conducted with or not conducted with the second terminal; and an operation sensor electrically connecting with the control terminal for sensing an operation generating the pressure and outputting the trigger signal according to the operation.

According to an embodiment of the present disclosure, a piezoelectric sensing circuit comprising: a piezoelectric sensor comprising a sensor output terminal, wherein the piezoelectric sensor outputs a sensing signal through the sensor output terminal according to a rate of change of pressure sensed by the piezoelectric sensor; a voltage stabilizer comprising a positive terminal electrically connecting with the sensor output terminal, wherein the voltage stabilizer receives the sensing signal outputted by the piezoelectric sensor, stores an energy of the sensing signal, and keeps a voltage of the sensing signal as a constant when the rate of change of pressure is zero; and a discharger comprising a first terminal connecting with the positive terminal, a second terminal coupled to ground, and a control terminal configured to receive a trigger signal and controlling the first terminal conducted with or not conducted with the second terminal, wherein the trigger signal is associated with an operation generating the pressure.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawings.

Figure 1:
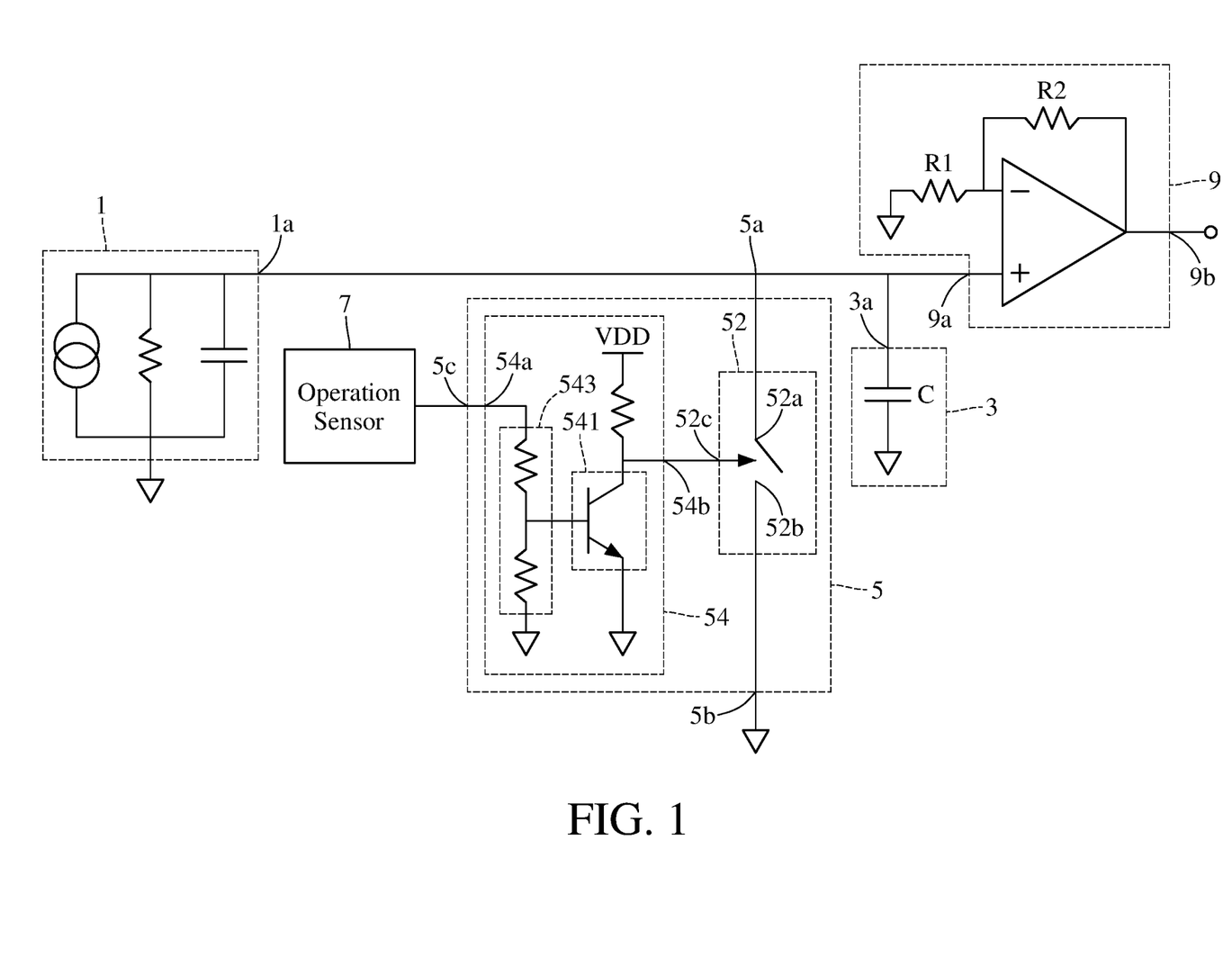
FIG. 1 is an architecture of the piezoelectric sensing system according to a first embodiment of the present disclosure.

Please refer to FIG. 1, which illustrates an architecture of the piezoelectric sensing system according to the first embodiment of the present disclosure. As shown in FIG. 1, the piezoelectric sensing system according to the first embodiment of the present disclosure includes a piezoelectric sensor 1, a voltage stabilizer 3, a discharger 5, an operation sensor 7, and an amplifier 9. However, in other embodiments of the present disclosure, at least one of the above elements may be omitted depending on the practical requirement, and the details will be described later. In addition, a piezoelectric sensing circuit of this piezoelectric sensing system may include some of the above elements, such as the piezoelectric sensor 1, the voltage stabilizer 3, and the discharger 5 at least.

Please refer to FIG. 1. The piezoelectric sensor 1 includes a sensor output terminal 1a. The piezoelectric sensor 1 outputs a sensing signal through the sensor output terminal 1a according to a rate of change of pressure sensed by the piezoelectric sensor 1. Specifically, there is a piezoelectric material in the piezoelectric sensor 1. In the progress of the piezoelectric material being pressed and deformed by an external force, the piezoelectric material generates positive and negative charges between two opposite surfaces correspondingly in order to resist the effect due to the shortened distance between two electrodes in the body of the piezoelectric material. On the other hand, when the piezoelectric material returns to its original state due to the disappearance of the applied external force, the distance between said two electrodes returns to its original length, and the piezoelectric material generates positive and negative charges between the two surfaces again; however, the polarity of the charges caused by releasing the external force is opposite to the polarity of the charges caused by applying the external force. Additionally, the type of the piezoelectric material used in the present disclosure is not limited.

Please refer to FIG. 1. The voltage stabilizer 3 includes a positive terminal 3a electrically connecting with the sensor output terminal 1a of the piezoelectric sensor 1. In this embodiment, the voltage stabilizer 3 is preferably to connect with the piezoelectric sensor 1 in parallel. The voltage stabilizer 3 receives and stores the sensing signal outputted by the piezoelectric sensor 1. Specifically, in the progress of the piezoelectric material of the piezoelectric sensor 1 being pressed and deformed by the external force, because of the positive charges generated in the piezoelectric material of the piezoelectric sensor 1, the voltage stabilizer 3 accumulates and stores these positive charges so as to form and keep a high electric potential at the positive terminal 3a. Thereafter, in the progress that the piezoelectric material of the piezoelectric sensor 1 returns to its original state due to the disappearance of the applied external force, because of the negative charges generated in the piezoelectric material of the piezoelectric sensor 1, the voltage stabilizer 3 returns to low electric potential by releasing the stored charges via the positive terminal 3a. As described above, the voltage stabilizer 3 keeps a voltage of the sensing signal as a constant when the rate of change of pressure is zero. As shown in FIG. 1, the voltage stabilizer 3 includes a capacitance element C in an example, a positive terminal of the capacitance element C is served as the positive terminal 3a of the voltage stabilizer 3, and a negative terminal of the capacitance element C coupled to ground, wherein the capacitance element C is preferably to be implemented by a capacitor. In view of the above, the capacitance element C may store the positive charges of the sensing signal when the piezoelectric sensor 1 senses the pressure, and keep the high electric potential at the positive terminal 3a when the applied pressure is not further increased. On the other hand, the capacitance element C may release the positive charges stored previously when the piezoelectric sensor 1 senses the removal of the pressure so that the positive terminal 3a may return to the low electric potential once the pressure is removed.

Please refer to FIG. 1. The discharger 5 includes a first terminal 5a, a second terminal 5b, and a control terminal 5c, wherein the first terminal 5a connects to the positive terminal 3a of the voltage stabilizer 3, the second terminal 5b coupled to ground, and the control terminal 5c is configured to receive a trigger signal and controlling the first terminal 5a being conducted with or being not conducted with the second terminal 5b. Since the amount of positive charges generated in the piezoelectric element of the piezoelectric sensor 1 when pressure is increased may not equal to the amount of negative charges generated in the piezoelectric element of the piezoelectric sensor 1 when pressure is released, it is preferable to conduct the first terminal 5a and the second terminal 5b of the discharger 5 to release the residual charges in the voltage stabilizer 3 to ground.

Specifically, the discharger 5 includes a conducting switch 52 and a trigger circuit 54. The conducting switch 52 includes a switch input pin 52a, a switch output pin 52b, and a control pin 52c, wherein the switch input pin 52a is served as the first terminal 5a of the discharger 5, the switch output pin 52b is served as the second terminal 5b of the discharger 5, and the control pin 52c connects to the trigger circuit 54. Therefore, the electrical connection relationship between the switch input pin 52a and the switch output pin 52b may be determined based on the signal received by the control pin 52c. The trigger circuit 54 includes a signal input pin 54a and a command output pin 54b, wherein the signal input pin 54a is served as the control terminal 5c of the discharger 5 and the command output pin 54b connects to the control pin 52c of the conducting switch 52. In an example of this embodiment, the trigger circuit 54 includes a transistor switch 541 and a voltage divider 543. The voltage divider 543 is connected between the transistor switch 541 and the signal input pin 54a. The transistor switch 541 is connected between the voltage divider 543 and the command output pin 54b. Therefore, the voltage divider 543 may adjust the voltage of the trigger signal to a voltage level suitable for the transistor switch 541 when receiving the trigger signal via the signal input pin 54a. The transistor switch 541 may generate a switching command signal corresponding to the adjusted trigger signal and send the switching command signal to the command output pin 54b, and then the switching command signal is outputted to the conducting switch 52 to conduct the first terminal 5a with the second terminal 5b or not to conduct the first terminal 5a with the second terminal 5b. Moreover, with a DC power source electrically connecting with the drain (when the transistor switch 541 is a NMOS) or the collector (when the transistor switch 541 is BJT) of the transistor switch 541 through a resistor, a voltage level of the switching command signal may be greater than a voltage level of the trigger signal").

Please refer to FIG. 1. The operation sensor 7 electrically connects to the control terminal 5c of the discharger 5. The operation sensor 7 is configured to sense an operation in which the pressure is generated and outputs the trigger signal according to the operation. In an embodiment, the operation sensor 7 is, for example, a proximity switch disposed in a punching machine. The proximity switch is enabled during the punching stroke performed by a machinery. However, the hardware type of the operation sensor 7 and the activation timing thereof is not thus limited in the present disclosure.

Please refer to FIG. 1. The amplifier 9 is a voltage amplifier in this embodiment. The amplifier 9 includes an amplifying input terminal 9a and an amplifying output terminal 9b, wherein the amplifying input terminal 9a connects to the positive terminal 3a of the voltage stabilizer 3 and the amplifying output terminal 9b is served as the output of the amplifier 9. The amplifier 9 is configured to amplify a voltage of the positive terminal 3a of the voltage stabilizer 3 with a default proportion and output an amplified voltage via the amplifying output terminal 9b, wherein the amplified voltage is served as an output voltage of the piezoelectric sensing system. Said proportion may be arranged according to the need by selecting the resistors R1 and R2 of the amplifier 9 having suitable resistance values in advance.

In view of the above structure of this embodiment, when the piezoelectric sensing system is in operation, the operation sensor 7 senses an operation firstly and outputs a trigger signal to the voltage divider 543 of the trigger circuit 54, and the trigger signal is adjusted by the voltage divider 543 is sent to the transistor switch 541 for controlling the command output pin 54b to output the switching command signal with low voltage level. At this timing, the conducting switch 52 is an open-circuit (namely, the switch input pin 52a is not conducted with the switch output pin 52b) corresponding to the switching command signal with low voltage level. Afterwards, when the pressure generated by the operations described previously is sensed, the piezoelectric sensor 1 generates a sensing signal and sends this sensing signal to the voltage stabilizer 3 to make the positive terminal 3a of the voltage stabilizer 3 being at a high electric potential accordingly. Because the voltage stabilizer 3 stores charges in the capacitance element C, the high electric potential at the positive terminal 3a can be kept in a constant state as long as the pressure responded by the piezoelectric sensor 1 does not change. At this timing, the amplifier 9 receives the sensing signal via the amplifying input terminal 9a and outputs this sensing signal through the amplifying output terminal 9b after amplifying this sensing signal.

On the other hand, when the piezoelectric sensor 1 senses that the pressure is decreased or is even removed completely, the voltage level of the sensing signal outputted by the piezoelectric sensor 1 is thus lowered correspondingly, and it causes that the electric potential at the positive terminal 3a of the voltage stabilizer 3 changes from high to low. At this timing, the amplified sensing signal outputted by the amplifier 9 through the amplifying output terminal 9b is also greatly reduced. Thereafter, the operation sensor 7 stops outputting the trigger signal to the voltage divider 543 of the trigger circuit 54 when sensing that the operation described previously disappears, and this causes the transistor switch 541 to be in a cut-off state and causes the command output pin 54b to further output a switching command signal with high voltage level. At this timing, the conducting switch 52 is in a conductive state (namely, the switch input pin 52a is conducted with the switch output pin 52b), so charges still residing in the voltage stabilizer 3 may be released by the discharger 5 to ground. Therefore, the correctness of the next sensing task will not be affected by the residual charges in the capacitance element C.

Practically, the amplifier 9 may be selectively configured depend on the requirement when implementing the above embodiments. For example, the amplifier 9 of this embodiment may be omitted if the voltage level kept as a constant by the voltage stabilizer 3 is sufficient for the following procedure performed by the next circuit stage connecting with the piezoelectric sensing system, and the positive terminal 3a of the voltage stabilizer 3 may be served as the output terminal of the piezoelectric sensing system.

Figure 2:
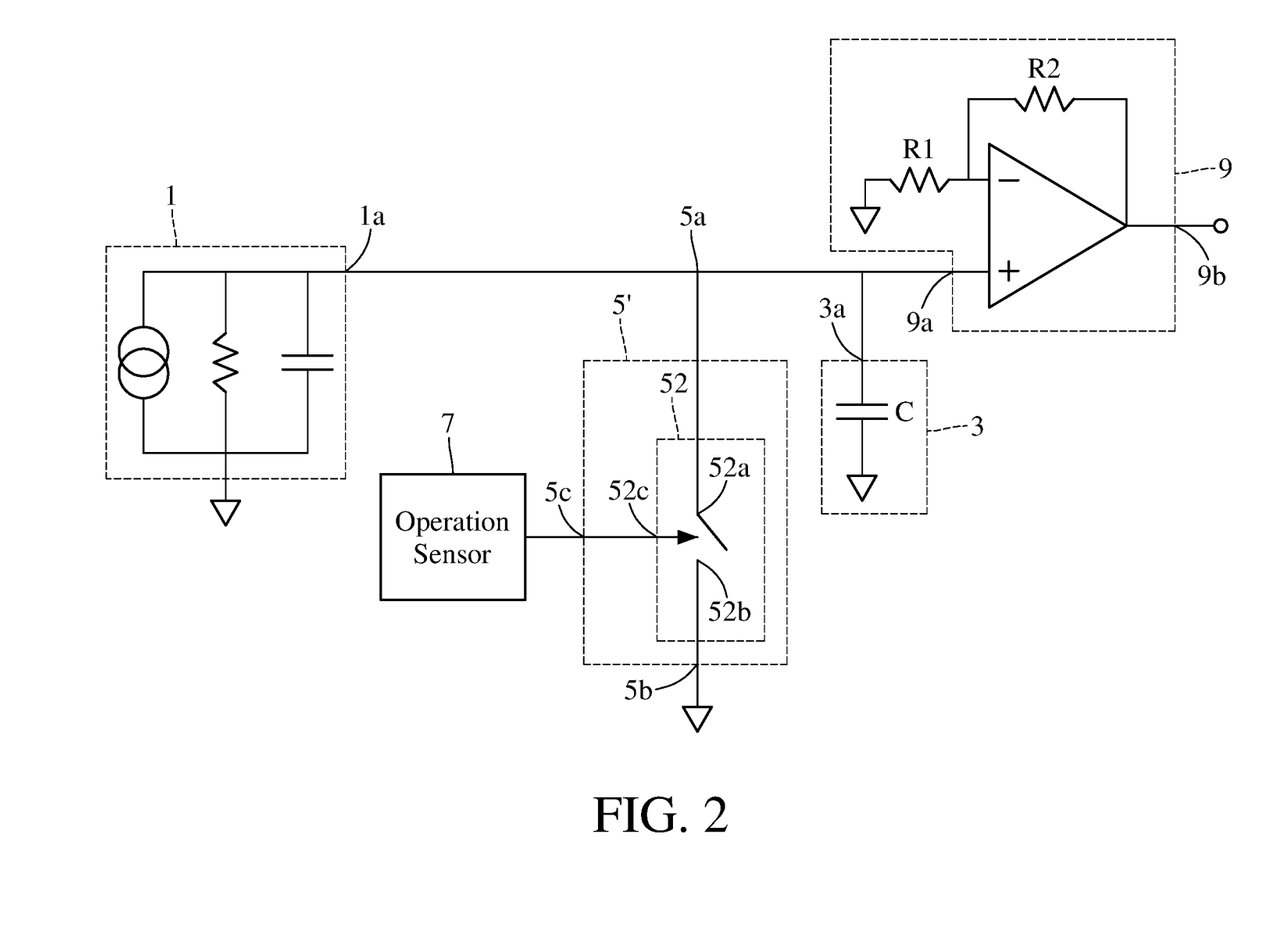
FIG. 2 is an architecture of the piezoelectric sensing system according to a second embodiment of the present disclosure.

Please refer to FIG. 2, which illustrates an architecture of the piezoelectric sensing system according to the second embodiment of the present disclosure. In comparison with the first embodiment described previously, the trigger circuit 54 referred in the first embodiment is omitted from the discharger 5' of this embodiment; namely, the control pin 52c of the conducting switch 52 is served as the control terminal 5c of the discharger 5'. In other words, the trigger circuit 54 may be omitted when the power of the trigger signal outputted by the operation sensor 7 is sufficient to drive the conducting switch 52; namely, it is unnecessary to additionally use the DC power source to generate the switching command signal with higher power or voltage level according to the trigger signal. This embodiment may also be adapted to the example of the first embodiment that arranged without the amplifier 9, and the present disclosure is not limited thereto.

Figure 3:
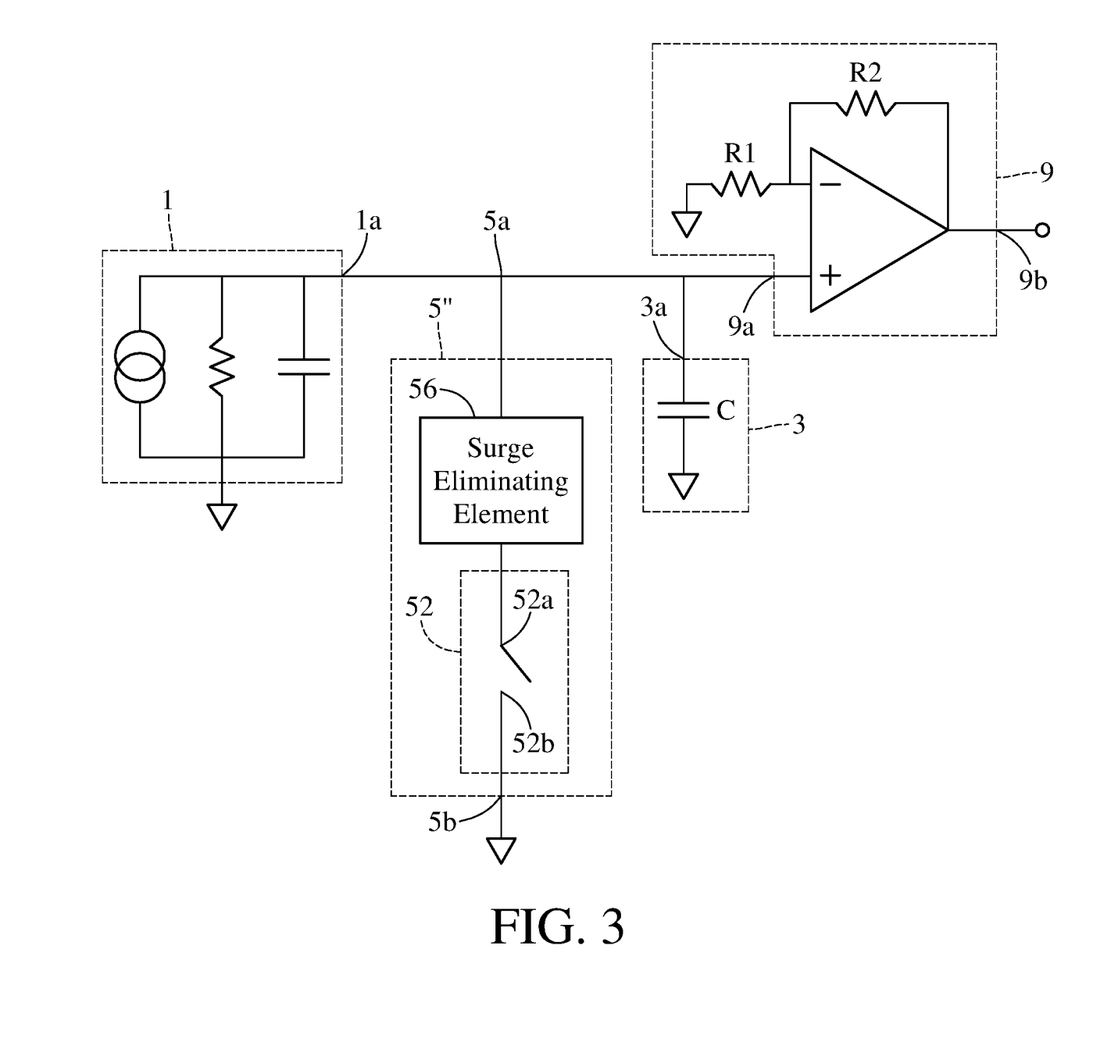
FIG. 3 is an architecture of the piezoelectric sensing system according to a third embodiment of the present disclosure.

Please refer to FIG. 3, which illustrates an architecture of the piezoelectric sensing system according to the third embodiment of the present disclosure. In comparison with the first embodiment described previously, the discharger 5" of this embodiment not only omits the trigger circuit 54 but also selectively includes a surge eliminating element 56 connected in series between the discharger 5" and the positive terminal 3a. In addition, the operation sensor 7 may be also omitted from this embodiment. Specifically, when the piezoelectric sensor 1 and the amplifier 9 are able to bear the voltage level of the surge generated by the proximity switch, or when damages to the piezoelectric sensor 1 and the amplifier 9 caused by switching surges can be avoided by adopting the surge eliminating element 56, the conducting switch 52 of the discharger 5" may be served as the proximity switch. This embodiment may also be adopted to the example of the first embodiment that omits the amplifier 9 and the present disclosure does not limit thereof.

Figure 4:
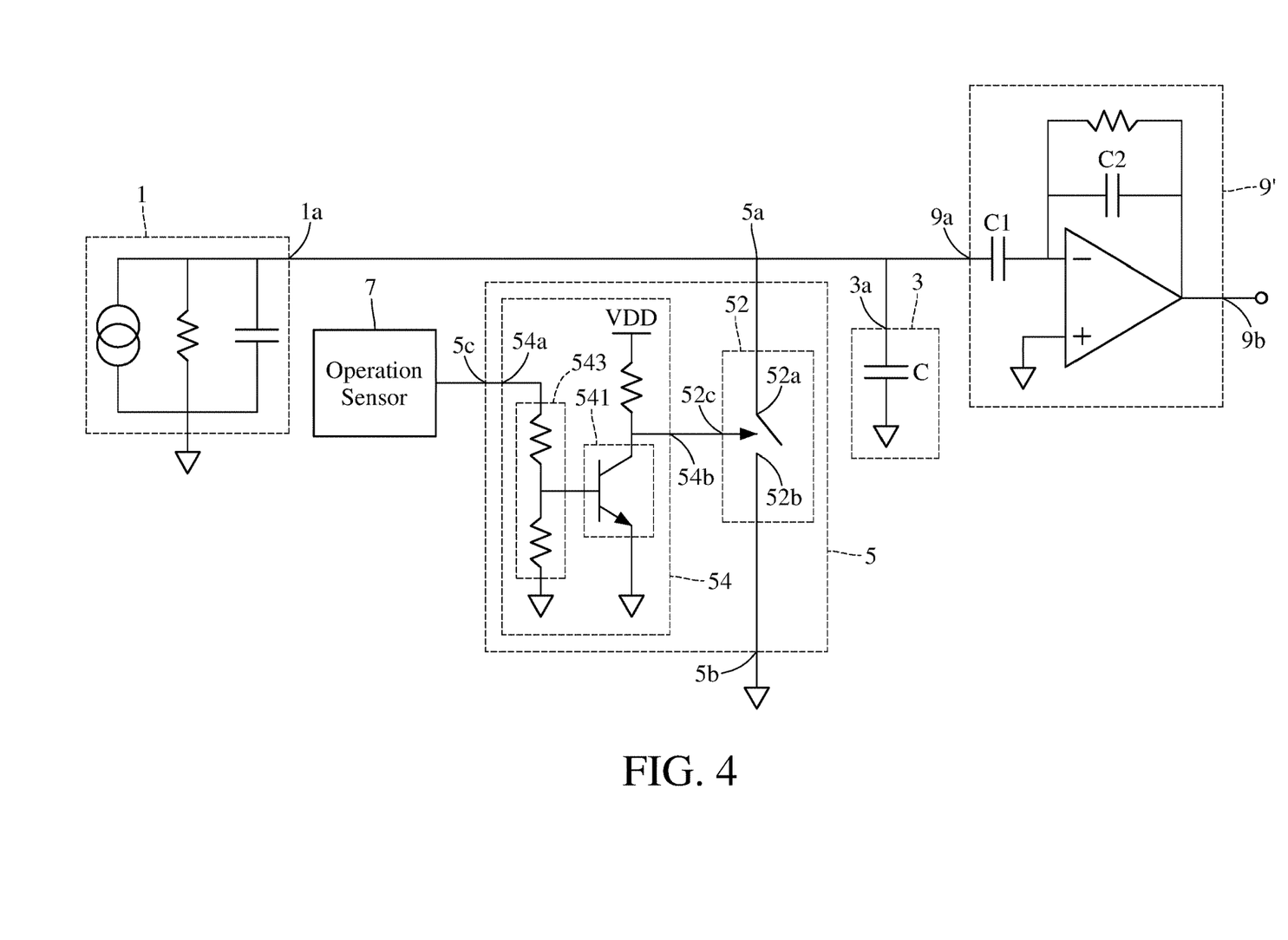
FIG. 4 is an architecture of the piezoelectric sensing system according to a fourth embodiment of the present disclosure.

Please refer to FIG. 4, which illustrates an architecture of the piezoelectric sensing system according to the fourth embodiment of the present disclosure. The difference between this embodiment and the first embodiment lies in that the amplifier 9' of this embodiment is a charge amplifier, wherein a gain proportion for amplifying the voltage of the charge amplifier may be arranged according to the need by selecting the capacitance elements C1 and C2 of the amplifier 9 having suitable capacitance values in advance.

Figure 5:
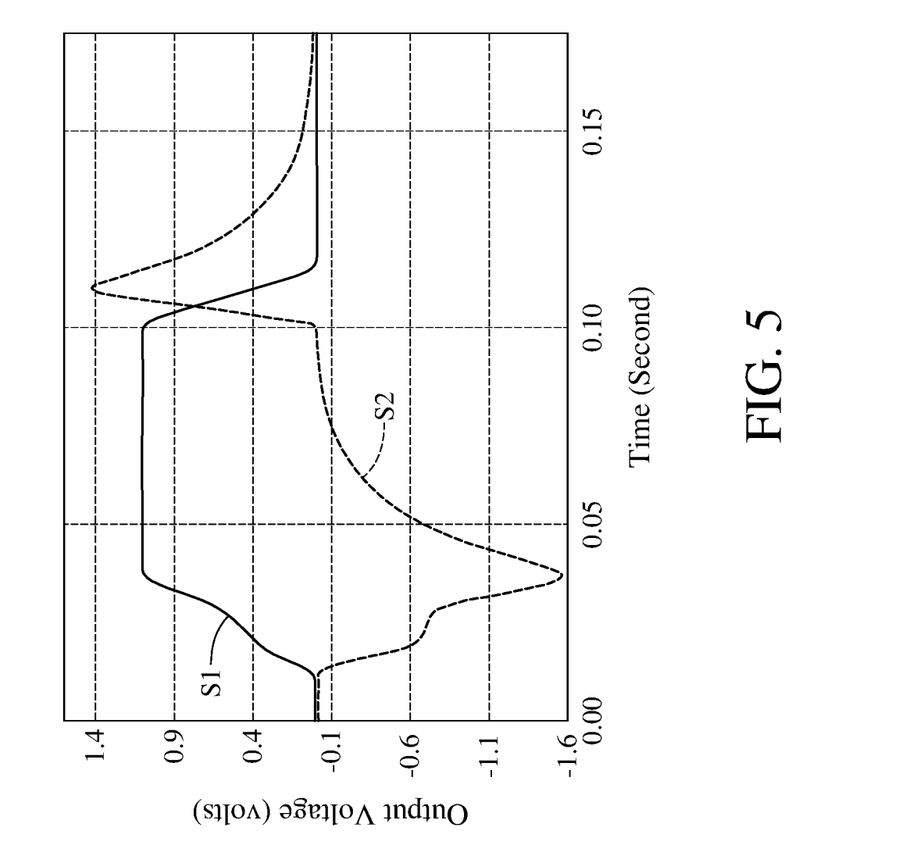
FIG. 5 shows the voltage-to-time curves for comparison between an output voltage of an embodiment of the present disclosure and an output voltage of conventional piezoelectric sensor.

Please refer to FIG. 5, which shows the voltage-to-time curves for comparison between an output voltages of an embodiment of the present disclosure and an output voltage of conventional piezoelectric sensor. The curve S1 shows an output voltage generated by the piezoelectric sensing system of the present disclosure, and the curve S2 shows a signal outputted by a readout circuit of a conventional piezoelectric sensor. As shown in FIG. 5, in the operation progress of the conventional piezoelectric sensor, when the applied pressure gradually increases and then stops increasing, the output voltage of a conventional piezoelectric sensor may gradually reach an extreme value and then gradually reach to zero from the extreme value with time. On the other hand, in the progress that the applied pressure gradually decreases until it is totally released, the output voltage of a conventional piezoelectric sensor may gradually reach another extreme value and then gradually reach to zero from said another extreme value with time. In comparison with the conventional piezoelectric sensor, when the applied pressure reaches its maximum, the voltage stabilizer 3 of an embodiment of the present disclosure may keep the voltage value as a constant; when the applied pressure start to decrease, the piezoelectric sensing system may use the discharger 5 to react quickly and ensure the output voltage is zero after the applied pressure is totally released.

In view of the above, the piezoelectric sensing system and the piezoelectric sensing circuit may use the charge eliminating technique implemented by the voltage stabilizer to improve the accuracy of the voltage output based on the pressure output without generating an accumulated error. In other words, the piezoelectric sensing system and the piezoelectric sensing circuit may directly output an undistorted pressure characteristic behavior, and convert the circuit gain to obtain the power value without additional software calculation. In overall, the piezoelectric sensing system and the piezoelectric sensing circuit inside the system may improve the stability of voltage output and improve the determination accuracy of the voltage output based on the pressure output of the piezoelectric sensor.

What is claimed is:
1. A piezoelectric sensing system comprising:
   a piezoelectric sensor, comprising a sensor output terminal, wherein the piezoelectric sensor outputs a sensing signal through the sensor output terminal according to a rate of change of pressure sensed by the piezoelectric sensor;
a voltage stabilizer, comprising a positive terminal electrically connecting with the sensor output terminal, wherein the voltage stabilizer receives the sensing signal outputted by the piezoelectric sensor, stores an energy of the sensing signal, and keeps a voltage of the sensing signal as a constant when the rate of change of pressure is zero;
a discharger, comprising a first terminal connecting with the positive terminal, a second terminal coupled to ground, and a control terminal configured to receive a trigger signal and controlling the first terminal conducted with or not conducted with the second terminal; and
an operation sensor, electrically connecting with the control terminal for sensing an operation generating the pressure and outputting the trigger signal according to the operation.

2. The piezoelectric sensing system of claim 1, wherein the voltage stabilizer comprises a capacitance element, a positive terminal of the capacitance element is served as the positive terminal of the voltage stabilizer and a negative terminal of the capacitance element coupled to ground.

3. The piezoelectric sensing system of claim 1, wherein the discharger comprises a conducting switch, the conducting switch comprises a switch input pin serving as the first terminal of the discharger, a switch output pin serving as the second terminal of the discharger, and a control pin serving as the control terminal of the discharger, wherein the energy stored in the voltage stabilizer is released when the first terminal and the second terminal are conducted.

4. The piezoelectric sensing system of claim 1, wherein the discharger comprises a conducting switch and a trigger circuit, the conducting switch comprises a switch input pin serving as the first terminal of the discharger, a switch output pin serving as the second terminal of the discharger, and a control pin connecting with the trigger circuit, wherein the trigger circuit comprises a signal input pin serving as the control terminal of the discharger and a command output pin connecting with the control terminal serving as the control terminal of the discharger, wherein the energy stored in the voltage stabilizer is released when the first terminal and the second terminal are conducted.

5. The piezoelectric sensing system of claim 4, wherein the trigger circuit further comprises a transistor switch and a voltage divider, the voltage divider is connected between the transistor switch and the signal input pin, the transistor switch is connected between the voltage divider and the command output pin, and the transistor switch is configured to generate a switching command signal corresponding to the trigger signal, and to output the switching command signal to the conducting switch, wherein a voltage level of the switching command signal is greater than a voltage level of the trigger signal.

6. The piezoelectric sensing system of claim 1, further comprising an amplifier, wherein the amplifier comprises an amplifying input terminal and an amplifying output terminal, the amplifying input terminal connects to the positive terminal of the voltage stabilizer, and the amplifier is configured to amplify a voltage of the positive terminal of the voltage stabilizer with a default proportion and output the voltage from the amplifying output terminal.

7. The piezoelectric sensing system of claim 6, wherein the amplifier is a voltage amplifier.

8. The piezoelectric sensing system of claim 6, wherein the amplifier is a charge amplifier.

9. A piezoelectric sensing circuit comprising:
a piezoelectric sensor comprising a sensor output terminal, wherein the piezoelectric sensor outputs a sensing signal through the sensor output terminal according to a rate of change of pressure sensed by the piezoelectric sensor;
a voltage stabilizer comprising a positive terminal electrically connecting with the sensor output terminal, wherein the voltage stabilizer receives the sensing signal outputted by the piezoelectric sensor, stores an energy of the sensing signal, and keeps a voltage of the sensing signal as a constant when the rate of change of pressure is zero; and
a discharger comprising a first terminal connecting with the positive terminal, a second terminal coupled to ground, and a control terminal configured to receive a trigger signal and controlling the first terminal conducted with or not conducted with the second terminal, wherein the trigger signal is associated with an operation generating the pressure.

10. The piezoelectric sensing circuit of claim 9, wherein the voltage stabilizer comprises a capacitance element, a positive terminal of the capacitance element is served as the positive terminal of the voltage stabilizer and a negative terminal of the capacitance element coupled to ground.

11. The piezoelectric sensing circuit of claim 9, wherein the discharger comprises a conducting switch, the conducting switch comprises a switch input pin serving as the first terminal of the discharger, a switch output pin serving as the second terminal of the discharger, and a control pin serving as the control terminal of the discharger, wherein the energy stored in the voltage stabilizer is released when the first terminal and the second terminal are conducted.

12. The piezoelectric sensing circuit of claim 9, wherein the discharger comprises a conducting switch and a trigger circuit, the conducting switch comprises a switch input pin serving as the first terminal of the discharger, a switch output pin serving as the second terminal of the discharger, and a control pin connecting with the trigger circuit, wherein the trigger circuit comprises a signal input pin serving as the control terminal of the discharger and a command output pin connecting with the control terminal serving as the control terminal of the discharger, wherein the energy stored in the voltage stabilizer is released when the first terminal and the second terminal are conducted.

13. The piezoelectric sensing circuit of claim 12, wherein the trigger circuit further comprises a transistor switch and a voltage divider, the voltage divider is connected between the transistor switch and the signal input pin, the transistor switch is connected between the voltage divider and the command output pin, and the transistor switch is configured to generate a switching command signal corresponding to the trigger signal, output the switching command signal to the conducting switch, wherein a voltage level of the switching command signal is greater than a voltage level of the trigger signal.

14. The piezoelectric sensing circuit of claim 9, further comprising an amplifier, wherein the amplifier comprises an amplifying input terminal and an amplifying output terminal, the amplifying input terminal connects to the of the positive terminal of the voltage stabilizer, and the amplifier is configured to amplify a voltage of the positive terminal of the voltage stabilizer with a default proportion and output the voltage from the amplifying output terminal.

15. The piezoelectric sensing circuit of claim 14, wherein the amplifier is a voltage amplifier.

16. The piezoelectric sensing circuit of claim 14, wherein the amplifier is a charge amplifier.

\* \* \* \* \*